(12) United States Patent
Kim et al.

(10) Patent No.: US 12,134,722 B2
(45) Date of Patent: Nov. 5, 2024

(54) PLASMA ETCHING METHOD

(71) Applicant: AJOU UNIVERSITY INDUSTRY-ACADEMIC COOPERATION FOUNDATION, Suwon-si (KR)

(72) Inventors: Chang-Koo Kim, Seoul (KR); Jun-Hyun Kim, Seongnam-si (KR); Jin-Su Park, Suwon-si (KR)

(73) Assignee: AJOU UNIVERSITY INDUSTRY-ACADEMIC COOPERATION FOUNDATION, Suwon-si (KR)

( * ) Notice: Subject to any disclaimer, the term of this patent is extended or adjusted under 35 U.S.C. 154(b) by 331 days.

(21) Appl. No.: 17/760,519

(22) PCT Filed: Jun. 1, 2020

(86) PCT No.: PCT/KR2020/007073
§ 371 (c)(1),
(2) Date: Mar. 15, 2022

(87) PCT Pub. No.: WO2021/054567
PCT Pub. Date: Mar. 25, 2021

(65) Prior Publication Data
US 2022/0363989 A1    Nov. 17, 2022

(30) Foreign Application Priority Data
Sep. 16, 2019 (KR) .................. 10-2019-0113777

(51) Int. Cl.
*C09K 13/00* (2006.01)
*H01J 37/32* (2006.01)
*H01L 21/311* (2006.01)

(52) U.S. Cl.
CPC ........ *C09K 13/00* (2013.01); *H01J 37/32449* (2013.01); *H01L 21/31116* (2013.01); *H01J 2237/334* (2013.01)

(58) Field of Classification Search
None
See application file for complete search history.

(56) References Cited

U.S. PATENT DOCUMENTS

| 5,698,070 A | 12/1997 | Hirano et al. |
| 2012/0196445 A1* | 8/2012 | Lim .................... B81C 1/00928 |
| | | 156/345.29 |

(Continued)

FOREIGN PATENT DOCUMENTS

| JP | 2003-297807 A | 10/2003 |
| KR | 10-2010-0080774 A | 7/2010 |

(Continued)

OTHER PUBLICATIONS

International Search Report of PCT/KR2020/007073 dated Sep. 7, 2020 [PCT/ISA/210].

*Primary Examiner* — Roberts P Culbert
(74) *Attorney, Agent, or Firm* — Sughrue Mion, PLLC

(57) ABSTRACT

Disclosed is a plasma etching method including a first step of providing a mixed gas containing argon gas and vaporized 1,1,2,2-tetrafluoroethyl-2,2,2-trifluoroethyl ether having a molecular structure of a following Chemical Formula 1 to a plasma chamber in which an etching target is disposed; and a second step of etching the etching target using plasma generated from the mixed gas:

(Continued)

<Chemical Formula 1>

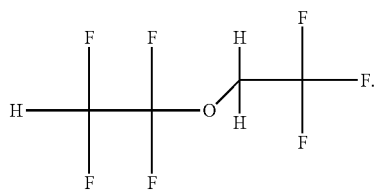

7 Claims, 9 Drawing Sheets

(56) References Cited

U.S. PATENT DOCUMENTS

2017/0243756 A1* 8/2017 Matsuura ............ H01J 37/3244
2019/0027368 A1* 1/2019 Matsuura .......... H01L 21/31116

FOREIGN PATENT DOCUMENTS

| KR | 10-1533526 B1 | 7/2015 |
| KR | 10-1699620 B1 | 1/2017 |
| KR | 10-2017-0076737 A | 7/2017 |
| KR | 10-1877827 B1 | 7/2018 |

* cited by examiner

FIG. 1

| | |
|---|---|
| Chemical structure | (structural diagram of HFE-347pcf2) |
| Chemical name | 1,1,2,2-tetrafluoroethyl-2,2,2-trifluoroethyl ether (HFE-347pcf2) |
| Cas no. | 406-78-0 |
| Molecular formula | $C_4H_3F_7O$ |
| M.W. (g/mol) | 200 |
| B.P. (°C) | 56.7 |
| Density (g/mL) | 1.487 @20°C |
| GWP | 580 |
| C/(F+O-H) | 0.8 |

200 nm hole pattern mask

PLASMA ETCHING METHOD

FIELD

The present disclosure relates to a plasma etching method using an etchant with a low global warming potential.

DESCRIPTION OF RELATED ART

Demand for a structure having a high aspect ratio due to high density of an integrated circuit and miniaturization of an element in a semiconductor device is increasing. In general, the high aspect ratio structure is manufactured in an insulating layer for electrically separating from a conductive layer. In order to manufacture such a high aspect ratio structure, a method of plasma etching silicon oxide ($SiO_2$) is widely used. Currently, in the plasma etching process of the silicon oxide, perfluorocarbon (PFC) gas such as $CF_4$, $C_2F_6$, $C_3F_6$, $C_3F_8$, $C_4F_8$, etc. is mainly used. The PFC gas generates various active species by plasma. In this connection, a fluorocarbon thin film made of a carbon-based polymer by $CF_x$ active species is deposited on a substrate surface to protect a mask and to serve as a source of etchant to improve selectivity with respect to the mask.

However, the fluorocarbon thin film deposited during the plasma etching may interfere with diffusion of reactive ions and radicals depending on a thickness thereof, thereby lowering an etching rate. Further, when etching stop occurs due to excessive deposition thereof on a sidewall of an etching target structure, etching is not performed to achieve a desired etching depth, and a diameter of a bottom of the etching target structure is smaller than a diameter of the mask.

Further, PFC is one of six major greenhouse gases ($CO_2$, $CH_4$, $N_2O$, HFC, PFC, $SF_6$). The PFC gas is chemically stable and has a long average residence time in the atmosphere and thus a high global warming potential (GWP) value which is 6500 times or higher than GWP of $CO_2$. Thus, the small amount of the PFC gas may greatly contribute to the global warming effect. In addition, as a proportion of the etching process in a semiconductor device manufacturing process increases, an annual discharge amount of the PFC gas is continuously increasing. Thus, in order to reduce the emission of PFC gas, various methods such as PFC gas decomposition, separation and recovery have been employed. However, those methods have fundamental limits due to the PFC gas having the high GWP.

Therefore, there is a need for a novel etchant which may replace the conventional PFC gas, have a low GWP and thus are environmentally friendly, have an excellent etching characteristic to allow a high aspect ratio etched structure to be formed, and a need for a plasma etching method using the novel etchant.

DISCLOSURE

Technical Purposes

One purpose of the present disclosure is to provide a plasma etching method using a novel etchant which may replace the conventional PFC gas having high GWP and may have a low GWP.

Technical Solutions

One aspect of the present disclosure provides a plasma etching method including a first step of providing a mixed gas containing argon gas and vaporized 1,1,2,2-tetrafluoroethyl-2,2,2-trifluoroethyl ether having a molecular structure of a following Chemical Formula 1 to a plasma chamber in which an etching target is disposed; and a second step of etching the etching target using plasma generated from the mixed gas:

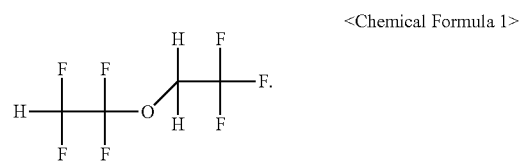 [SMILES: FC(F)C(F)(F)OCC(F)(F)F]

<Chemical Formula 1>

In one embodiment, the 1,1,2,2-tetrafluoroethyl-2,2,2-trifluoroethyl ether gas and the Ar gas are injected into the plasma chamber at a flow rate ratio in a range of 2:3 to 1:9.

In one embodiment, the 1,1,2,2-tetrafluoroethyl-2,2,2-trifluoroethyl ether gas and the Ar gas are injected into the plasma chamber at a flow rate ratio in a range of 10.5:19.5 to 1:4.

In one embodiment, the mixed gas further contains oxygen gas.

In one embodiment, the 1,1,2,2-tetrafluoroethyl-2,2,2-trifluoroethyl ether gas and the oxygen gas are injected into the plasma chamber at a flow rate ratio in a range of 9:1 to 7:3.

In one embodiment, the etching target includes silicon oxide or silicon nitride.

In one embodiment, a hole pattern mask is formed on a surface of the etching target, wherein in the second step, an etching target area exposed through the hole pattern mask is etched so that a high aspect ratio hole having a ratio between a diameter and a depth of 1:10 or greater is formed in the etching target.

Technical Effects

According to the present disclosure, the plasma etching process may be performed using the mixed gas of the HFE-347 which has a global warming potential (GWP) of 580 which is significantly lower than that of the PFC gas, and the Ar and $O_2$ gases. This may reduce greenhouse gas emission, compared to that in a semiconductor manufacturing process using the existing PFC gas. Thus, the etching process may be eco-friendly, and may have excellent etching characteristics. In particular, according to the plasma etching process of the present disclosure, a deposition rate of the fluorocarbon thin film on the etching target may be reduced and an etch rate may be increased. Thus, the etching target may be etched while appropriately controlling a thickness of the steady-state fluorocarbon thin film. When the plasma etching is performed using the hole pattern mask on the etching target, the high aspect ratio etched structure with little or no difference between a diameter of the hole pattern mask and a diameter of the etched structure may be formed.

BRIEF DESCRIPTION OF DRAWINGS

FIG. 1 is a view showing a molecular structure and physical properties of 1,1,2,2-tetrafluoroethyl-2,2,2-trifluoroethyl ether (HFE-347pcf2) according to the present disclosure.

DETAILED DESCRIPTIONS

Figure 2:
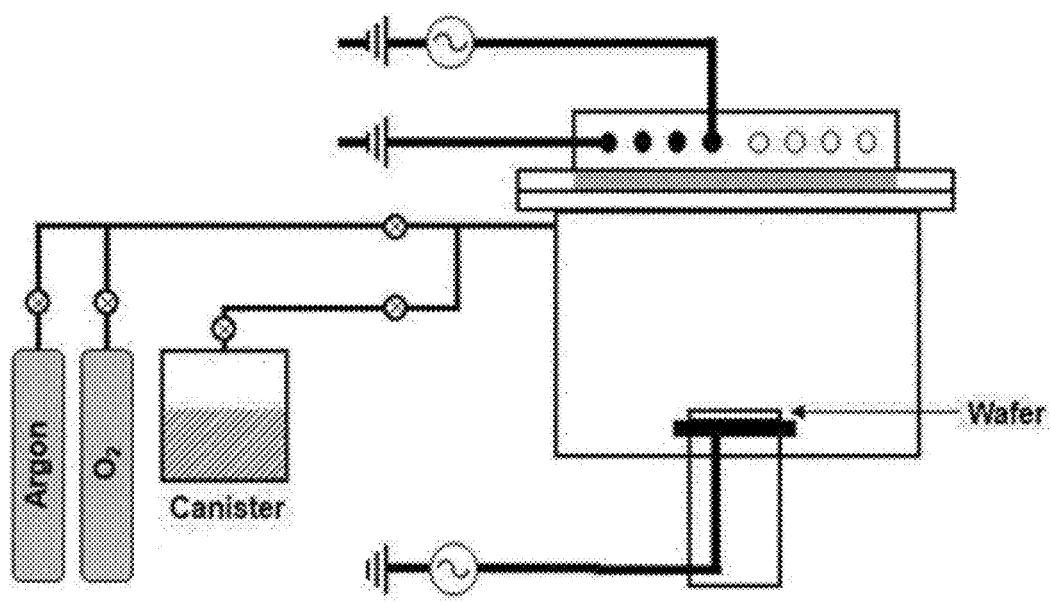
FIG. 2 shows a schematic diagram of a plasma etching apparatus for illustrating a plasma etching method according to an embodiment of the present disclosure.

Hereinafter, an embodiment of the present disclosure will be described in detail with reference to the accompanying drawings. The present disclosure may be variously modified and may take many forms. Thus, specific embodiments will be illustrated in the drawings and described in detail herein. However, the specific embodiments are not intended to limit the present disclosure thereto. It should be understood that all changes, equivalents thereto, or substitutes therewith are included in a scope and spirit of the present disclosure. In describing the drawing, similar reference numerals are used for similar components.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or greater other features, integers, operations, elements, components, and/or portions thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present disclosure relates to a high aspect ratio plasma etching method using a hydrofluoroether (hereinafter, referred to as HFE) having a lower global warming potential (GWP) than that of a conventional perfluorocarbon (PFC) in an etching method using plasma. Hydrofluoroether (HFE) used in the plasma etching method according to the present disclosure is composed of 4 carbons, 3 hydrogens, 1 oxygen, and 7 fluorines. In the etching method, hydrofluoroether (HFE-347) that exists in a liquid state at room temperature is used.

FIG. 1 is a diagram showing to molecular structure and physical properties of 1,1,2,2-tetrafluoroethyl-2,2,2-trifluoroethyl ether used in the plasma etching method according to the present disclosure. FIG. 2 shows a schematic diagram of a plasma etching apparatus for illustrating a plasma etching method according to an embodiment of the present disclosure.

Referring to FIG. 1 and FIG. 2, the plasma etching method according to the present disclosure includes a first step of providing a mixed gas including argon gas and vaporized 1,1,2,2-tetrafluoroethyl-2,2,2-trifluoroethyl ether (hereinafter, referred to as HFE-347pcf2) having a molecular structure of a following Chemical Formula 1 to a plasma chamber in which an etching target is disposed, and a second step of etching the etching target using plasma generated from the mixed gas.

<Chemical Formula 1>

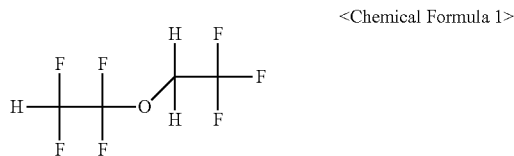 [SMILES: FC(F)C(F)(F)OCC(F)(F)F]

In the first step, in order to provide the HFE-347pcf2 vapor to the plasma chamber, a vessel containing liquid HFE-347pcf2 and a chamber connecting line connecting the vessel and the plasma chamber to each other are heated to vaporize the HFE-347pcf2. Since HFE-347pcf2 has a boiling point of about 56.7° C. and exists in a liquid state at room temperature, the liquid phase HFE-347pcf2 is vaporized to uniformly introduce the vaporized HFE-347pcf2 into the plasma chamber. In an embodiment, the vaporization of HFE-347pcf2 according to the present disclosure may be performed by heating a canister accommodating the liquid phase HFE-347pcf2 therein and the chamber connecting line connecting the canister and the plasma etching chamber to each other. In this connection, the canister is heated to a temperature above a boiling point of HFE-347pcf2 so that the liquid phase HFE-347pcf2 may be vaporized. The chamber connection line is heated to a higher temperature than the temperature to which the canister is heated, so that a flow rate does not fluctuate due to droplet splashing inside the plasma chamber. In one example, the canister may be heated to 90° C., and the chamber connection line may be heated to 110° C. In this connection, the canister may be heated using a heating jacket. The vaporized HFE-347, that is, the HFE-347pcf2 vapor is provided into the plasma chamber. In this connection, a mass flow controller may be installed just before the plasma chamber to keep a flow rate of the vaporized HFE-347pcf2 constant.

The mixed gas including the Ar gas as a dilution gas and the vaporized HFE-347pcf2 may be fed to the plasma chamber. When injecting the Ar gas thereto, a plasma density in the plasma etching process may increase and an etch rate may be easily controlled. The Ar gas is injected to the plasma chamber in a separate manner from the HFE-347pcf2 through a separate Ar gas injection line connected to the plasma chamber.

In one embodiment, when using 1,1,2,2-tetrafluoroethyl-2,2,2-trifluoroethyl ether having the Chemical Formula 1 based structure, the 1,1,2,2-tetrafluoroethyl-2,2,2-trifluoroethyl ether gas and the Ar gas may be provided into the plasma chamber at a flow rate ratio in a range of 2:3 to 1:9. Preferably, the flow rate ratio of the 1,1,2,2-tetrafluoroethyl-2,2,2-trifluoroethyl ether gas and the Ar gas may be in a range of 10.5:19.5 to 1:4.

In the first step, the mixed gas may further include $O_2$ gas. Injecting the $O_2$ gas into the plasma chamber may allow a steady-state fluorocarbon thin film to be controlled by plasma etching. This is effective in controlling a hole diameter of the high-aspect-ratio etched structure. In this case, the $O_2$ gas may be injected into the plasma chamber separately from the HFE-347pcf2 gas and the Ar gas through a separate $O_2$ gas injection line connected to the plasma chamber. The 1,1,2,2-tetrafluoroethyl-2,2,2-trifluoroethyl ether having the molecular structure of the Chemical Formula 1 and the $O_2$ gas may be provided at a flow rate ratio in a range of 9:1 to 7:3.

In the second step, the etching target may be any material that may be etched using the plasma etching method according to the present disclosure. Preferably, for example, the etching target may be silicon oxide such as silicon dioxide or silicon nitride.

Further, in the plasma etching method according to the present disclosure, a hole pattern mask may be formed on a surface of the etching target. An etching target area exposed through the hole pattern mask may be etched in the second step so that a high aspect ratio hole in which a ratio between a diameter and a depth is 1:10 or higher may be formed in the etching target.

According to the present disclosure, the plasma etching process may be performed using the mixed gas of the HFE-347 which has a global warming potential (GWP) of 580 which is significantly lower than that of the PFC gas, and the Ar and $O_2$ gases. This may reduce greenhouse gas emission, compared to that in a semiconductor manufacturing process using the existing PFC gas. Thus, the etching process may be eco-friendly, and may have excellent etching characteristics. In particular, according to the plasma etching process of the present disclosure, a deposition rate of the fluorocarbon thin film on the etching target may be reduced and an etch rate may be increased. Thus, the etching target may be etched while appropriately controlling a thickness of the steady-state fluorocarbon thin film. When the plasma etching is performed using the hole pattern mask on the etching target, the high aspect ratio etched structure with little or no difference between a diameter of the hole pattern mask and a diameter of the etched structure may be formed. A more specific description thereof will be described with reference to examples and experimental examples of the present disclosure below.

Hereinafter, a basic etching rate using HFE-347pcf2, etching rate and selectivity based on process conditions, and a plasma etching method for manufacturing an optimal high aspect ratio etched structure using a high aspect ratio etching will be described.

Experimental Example 1: Etch Rate Based on Flow Rate of Ar in HFE-347pcf2 Plasma In order to identify the etch rate based on the flow rate of Ar in the HFE-347pcf2 plasma, the Ar gas was provided to a plasma chamber while changing the flow rate of the Ar gas so that $SiO_2$ etching was performed. Then, $SiO_2$ was plasma etched using HFE-347pcf2 plasma. Specific plasma etching process conditions are shown in Table 1, and the etch rate based on the Ar flow rate is shown in FIG. 3.

TABLE 1

| Source power (W) | Bias voltage (V) | Discharge Gas | Total Flow Rate (sccm) | Pressure (mTorr) | Substrate Temperature (° C.) |
|---|---|---|---|---|---|
| 250 | −600 | HFE-347pcf2/Ar | 30 | 10 | 15 |

Figure 3:
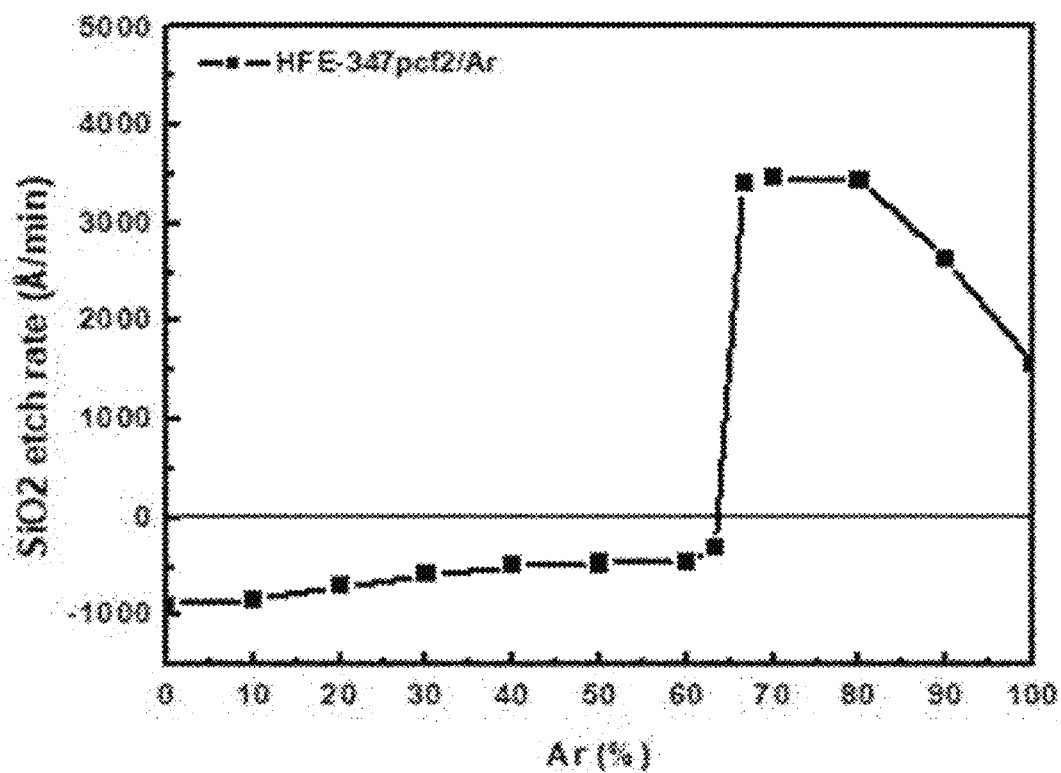
FIG. 3 is a diagram for illustrating a SiO$_2$ etch rate based on an Ar flow rate in HFE-347pcf2/Ar plasma according to the present disclosure.

Referring to FIG. 3, it may be identified that when the Ar flow rate ratio in the HFE-347pcf2 plasma is larger than 60%, the $SiO_2$ etch rate starts to increase, while the Ar flow rate ratio in the HFE-347pcf2 plasma is larger than 80%, the $SiO_2$ etch rate starts to decrease. It may be expected that the etch rate decreases because an amount of etchant that can etch $SiO_2$ decreases when the Ar flow rate ratio is 80% or larger. Further, it may be identified that $SiO_2$ is etched relatively quickly when the Ar flow rate ratio in the HFE-347pcf2 plasma is 67% (HFE-347pcf2 10 sccm, Ar 20 sccm). That is, according to the present disclosure, it may be identified that it is most desirable to provide the HFE-347pcf2 gas and the Ar gas into the plasma chamber at a flow rate ratio of 1:2. It may be expected that when the HFE-347pcf2 gas and the Ar gas are provided to the chamber at a flow rate ratio of 1:2, the etching target may be etched at an excellent etch rate.

Therefore, hereinafter, the Ar flow rate ratio is set to 67% (when the total flow rate is 30 sccm, a flow rate of HFE-347pcf2 is 10 sccm, and a flow rate of Ar is 20 sccm).

Experimental Example 2: Etch Rate and Etching Selectivity Based on Source Power in HFE-347pcf2/Ar Plasma Next, in order to identify the etch rate based on the source power in HFE-347pcf2/Ar plasma, the Ar flow rate ratio was set to be 67% of the total flow rate (Ar 20 sccm), the flow rate of HFE-347pcf2 was fixed to 10 sccm. Then, an etch rate of each of $SiO_2$, $Si_3N_4$, and an amorphous carbon layer (ACL) based on the source power was identified. Specific etching process conditions are shown in Table 2 below, and the results of measurements of the etch rate are shown in FIG. 4.

TABLE 2

| Source power (W) | Bias voltage (V) | Discharge Gas (X/Y) | Total Flow Rate (sccm) | Pressure (mTorr) | Substrate Temperature (° C.) |
|---|---|---|---|---|---|
| 200 to 500 | −600 | HFE-347pcf2/Ar | 30 (X/Y = 10/20) | 10 | 15 |

Figure 4:
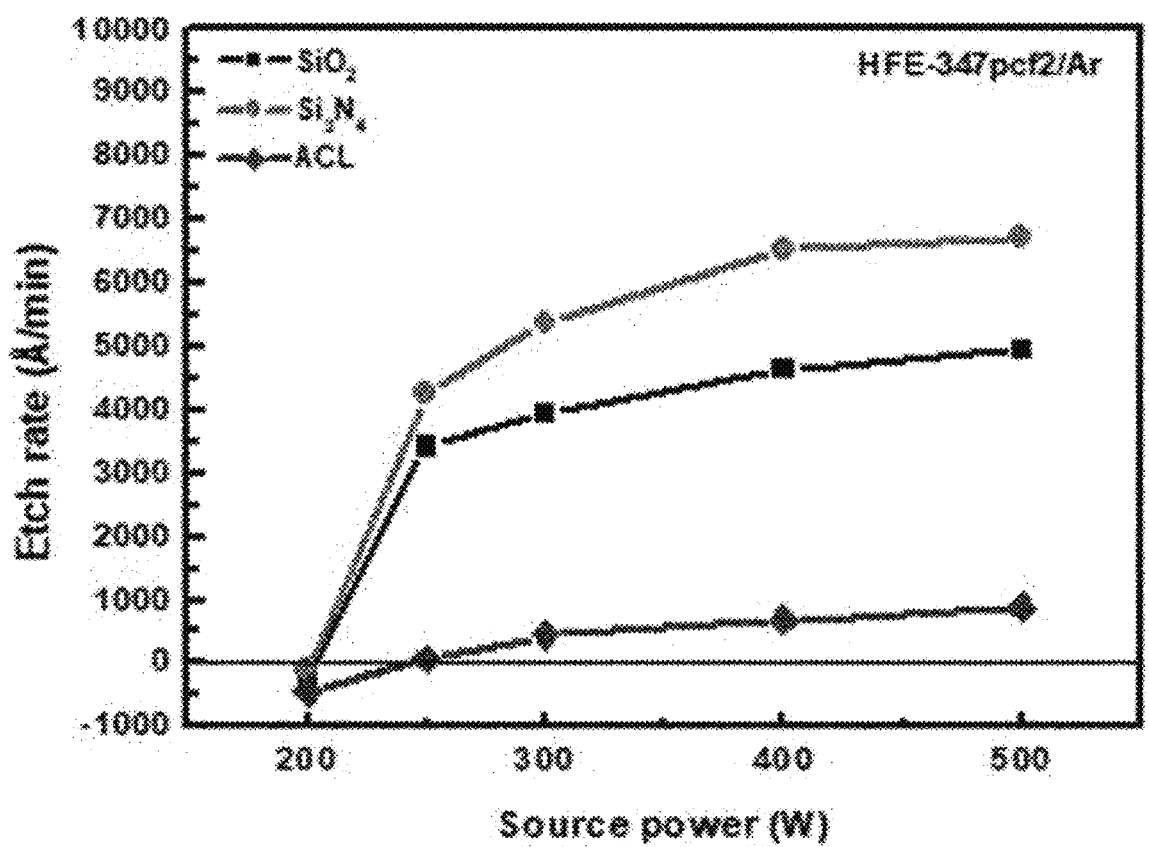
FIG. 4 is a diagram for illustrating an etch rate of each of SiO$_2$, Si$_3$N$_4$ and ACL based on source power in HFE-347pcf2/Ar plasma according to the present disclosure.

Referring to FIG. 4, it may be identified that the etch rate of each of $SiO_2$, $Si_3N_4$ and ACL using the HFE-347pcf2/Ar increases as the source power increases. It may be identified that among the etch rates of $SiO_2$, $Si_3N_4$ and ACL, the etch rate of $Si_3N_4$ is the highest while the etch rate of ACL is the lowest.

Further, the etching selectivity of HFE-347pcf2/Ar plasma based on the source power was calculated based on the etch rates of the $SiO_2$, $Si_3N_4$ and ACL as shown in FIG. 4. The etching selectivity of each of $SiO_2$/ACL and $Si_3N_4$/ACL was calculated, where ACL was used as an etching mask. The results are shown in FIG. 5.

Figure 5:
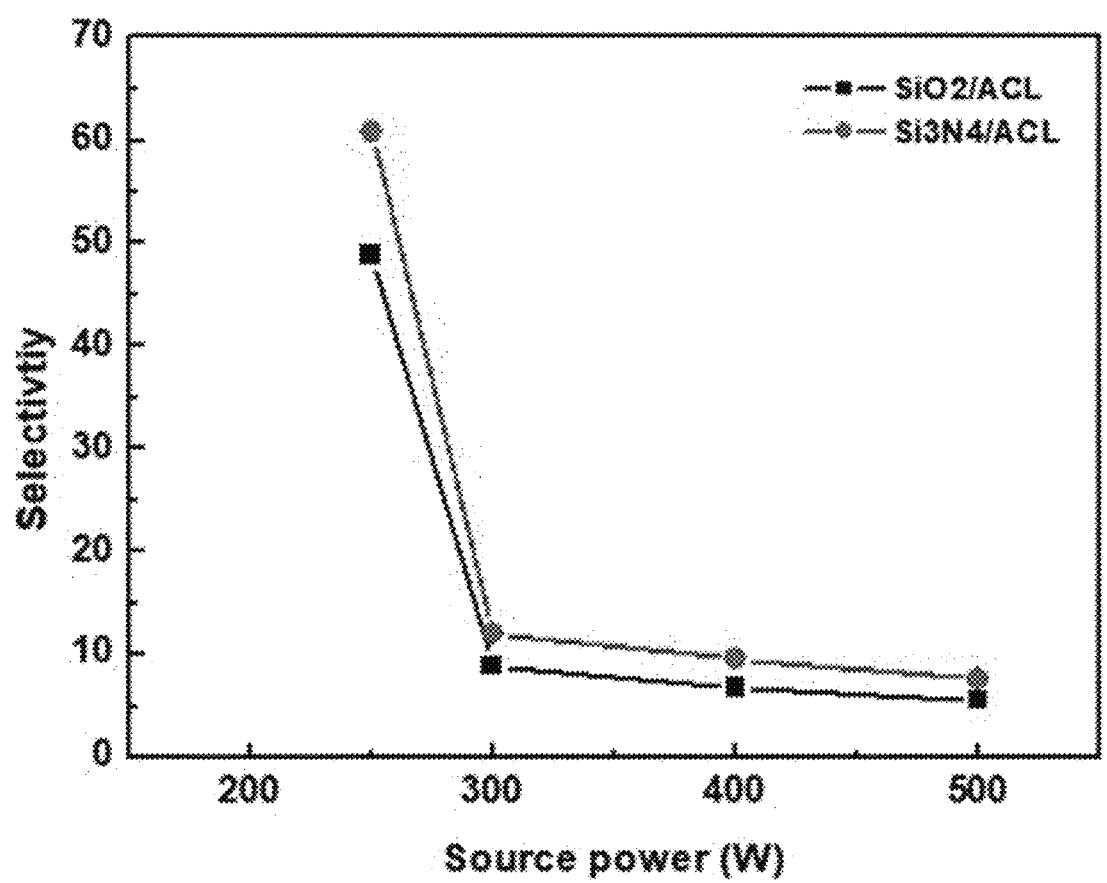
FIG. 5 is a diagram for illustrating an etching selectivity of each of SiO$_2$/ACL and Si$_3$N$_4$/ACL based on source power in HFE-347pcf2/Ar plasma according to the present disclosure.

Referring to FIG. 5, it may be identified that there is no etching selectivity due to deposition on ACL at 200 W source power, while the etching selectivity of $Si_3N_4/ACL$ is larger than that of $SiO_2/ACL$ under other source power conditions.

Experimental Example 3: Etch Rate and Etching Selectivity Based on Bias Voltage in HFE-347pcf2/Ar Plasma In order to identify the etch rate based on the bias voltage in HFE-347pcf2/Ar plasma, the Ar flow rate ratio was set to 67% of the total flow rate (Ar 20 sccm), and the flow rate of HFE-347pcf2 was fixed to 10 sccm. The etch rates of $SiO_2$, $Si_3N_4$ and amorphous carbon layer (ACL) based on the bias voltage were identified. Specific etching process conditions are shown in Table 3 below, and the etch rate is shown in FIG. 6.

TABLE 3

| Source power (W) | Bias voltage (V) | Discharge Gas (X/Y) | Total Flow Rate (sccm) | Pressure (mTorr) | Substrate Temperature (° C.) |
|---|---|---|---|---|---|
| 250 | −400 to −1200 | HFE-347pcf2/Ar | 30 (X/Y = 10/20) | 10 | 15 |

Figure 6:
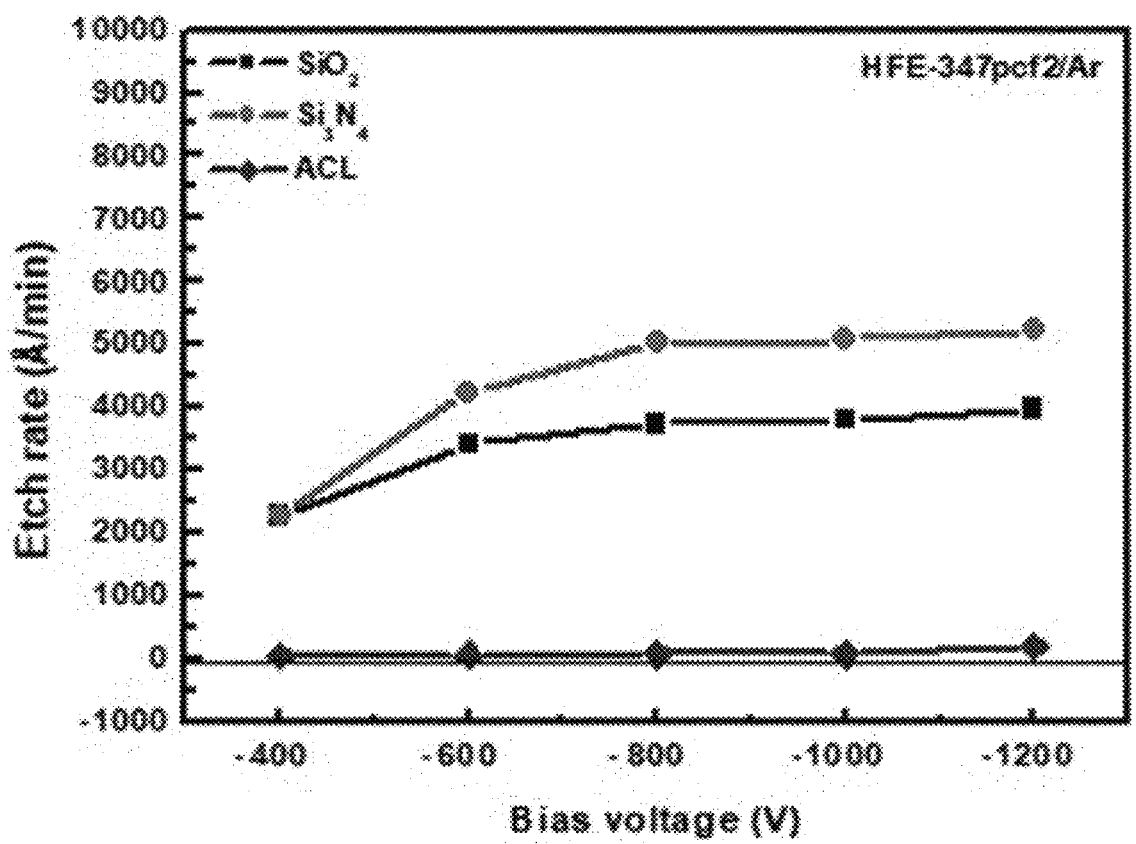
FIG. 6 is a diagram for illustrating an etch rate of each of SiO$_2$, Si$_3$N$_4$ and ACL based on a bias voltage in HFE-347pcf2/Ar plasma according to the present disclosure.

Referring to FIG. 6, it may be identified that the etch rate increases as the bias voltage increases. Further, it may be identified that the etch rate of $Si_3N_4$ is the highest.

Further, the etching selectivity in the HFE-347pcf2/Ar plasma based on the bias voltage was calculated based on the etch rates of the $SiO_2$, $Si_3N_4$ and ACL as shown in FIG. 6. The etching selectivity of each of $SiO_2/ACL$ and $Si_3N_4/ACL$ was calculated, where ACL was used as an etching mask. The results are shown in FIG. 7.

Figure 7:
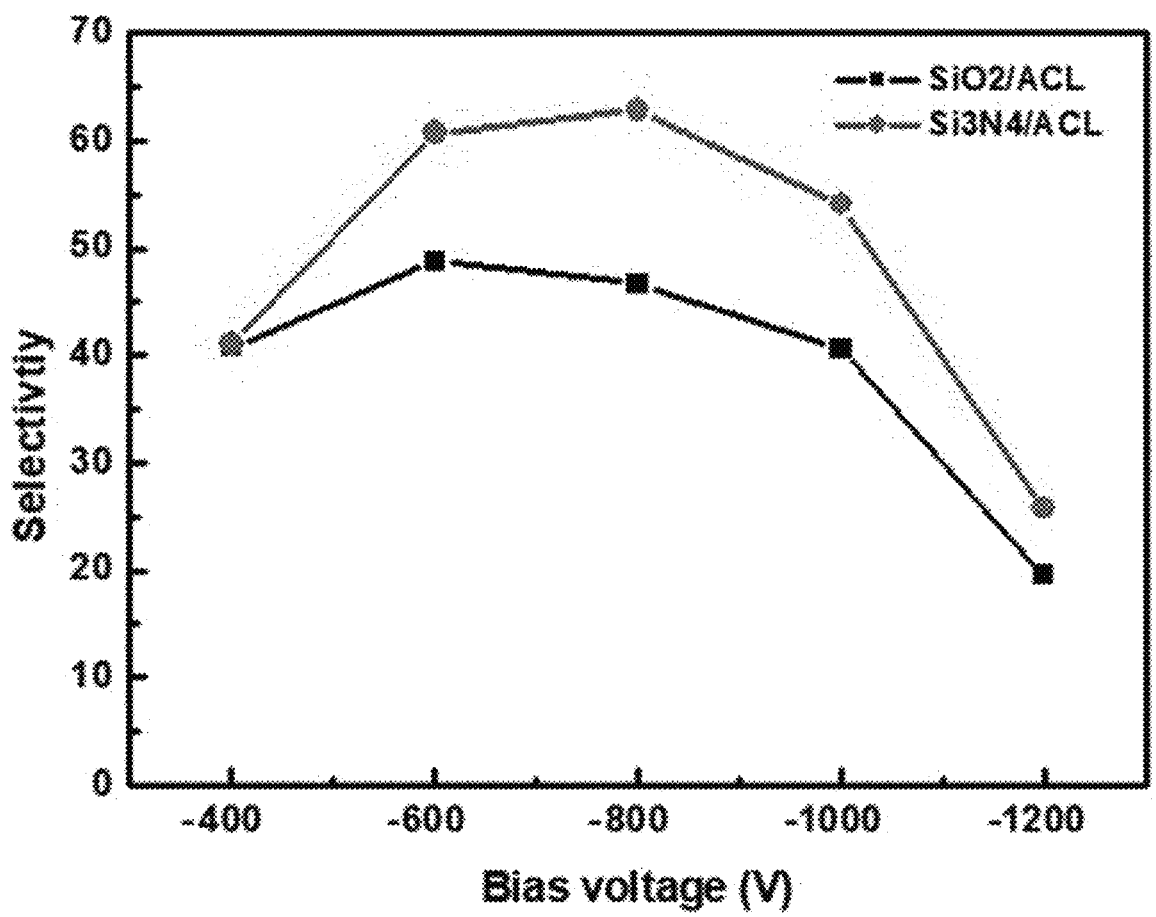
FIG. 7 is a diagram for illustrating an etching selectivity of each of SiO$_2$/ACL and Si$_3$N$_4$/ACL based on a bias voltage in HFE-347pcf2/Ar plasma according to the present disclosure.

Referring to FIG. 7, it may be identified that the ACL is etched at −400 V bias voltage. Further, it may be identified that the etching selectivity of $Si_3N_4/ACL$ is higher than that of $SiO_2/ACL$.

Experimental Example 4: Etching Using Each of HFE-347pcf2/Ar and HFE-347pcf2/Ar/$O_2$ In order to manufacture a high-aspect-ratio etched structure via the etching process using the HFE-347/Ar plasma according to the present disclosure, first, a hole pattern mask was formed on a specimen ($SiO_2$ thin film). The formed hole pattern mask was imaged using FE-SEM, and the result is shown in FIG. 8.

Figure 8:
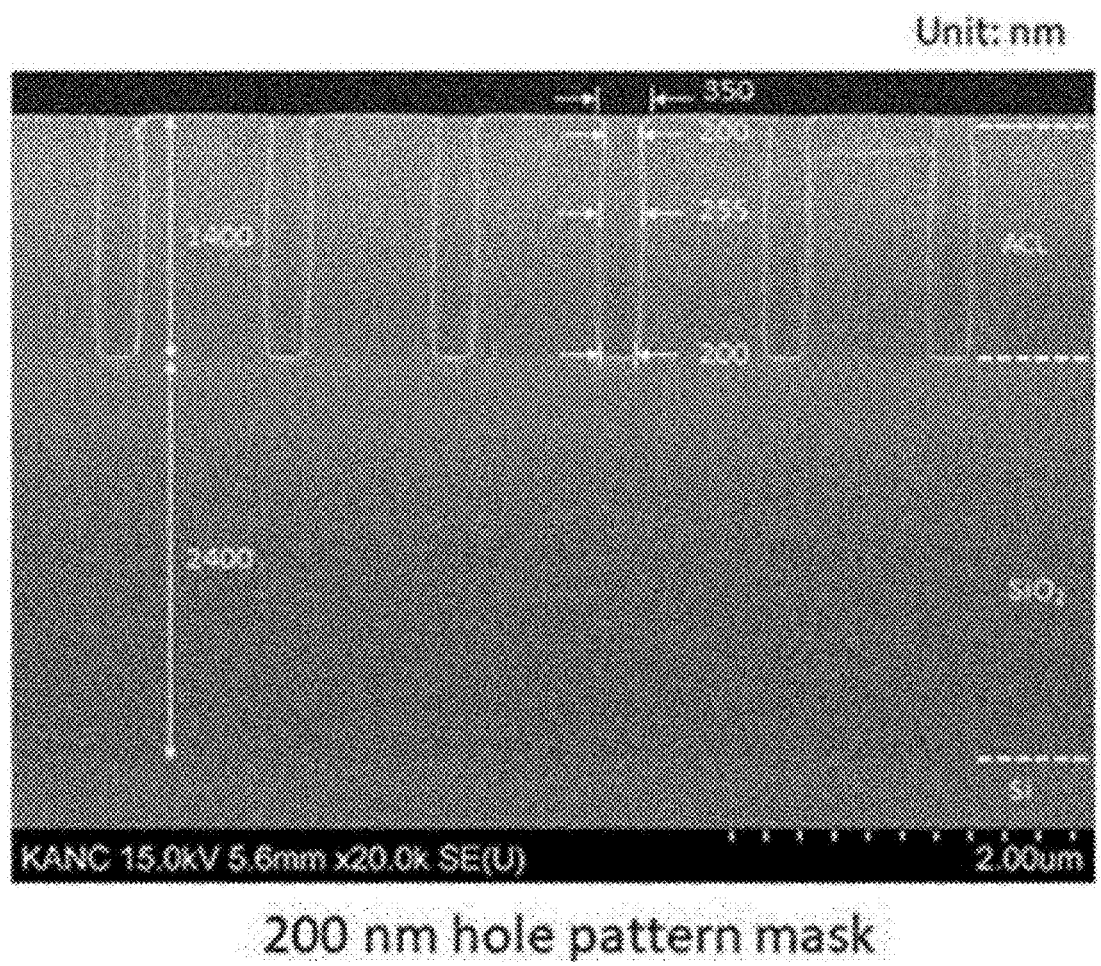
FIG. 8 is a view showing an FE-SEM image of a hole pattern mask specimen having a diameter of 200 nm to fabricate a high aspect ratio etched structure using HFE-347pcf2/Ar plasma according to the present disclosure.

Referring to FIG. 8, it may be identified that the hole pattern mask has a total thickness of 1400 nm, and has a structure in which a 50 nm SiON thin film is present on 1350 nm ACL, and is formed on a 2400 nm $SiO_2$ thin film. Further, it may be identified that a diameter of the formed hole pattern mask is 200 nm.

High aspect ratio etching of the specimen ($SiO_2$ thin film) on which the hole pattern mask prepared as described above is formed using each of HFE-347pcf2/Ar plasma and HFE-347pcf2/Ar/$O_2$ plasma was identified. Specifically, plasma etching was performed under conditions of following table 4. The result is shown in FIG. 9.

TABLE 4

| Source power (W) | Bias voltage (V) | Discharge Gas (X/Y) | Total Flow Rate (sccm) | Pressure (mTorr) | Substrate Temperature (° C.) | Etching time (min) |
|---|---|---|---|---|---|---|
| 250 | −1200 | HFE-347pcf2/Ar HFE-347pcf2/Ar/$O_2$ | 30 (X/Y = 10/20) 30 (X/Y/Z = 8/20/2) | 10 | 15 | 12 |

Figure 9:
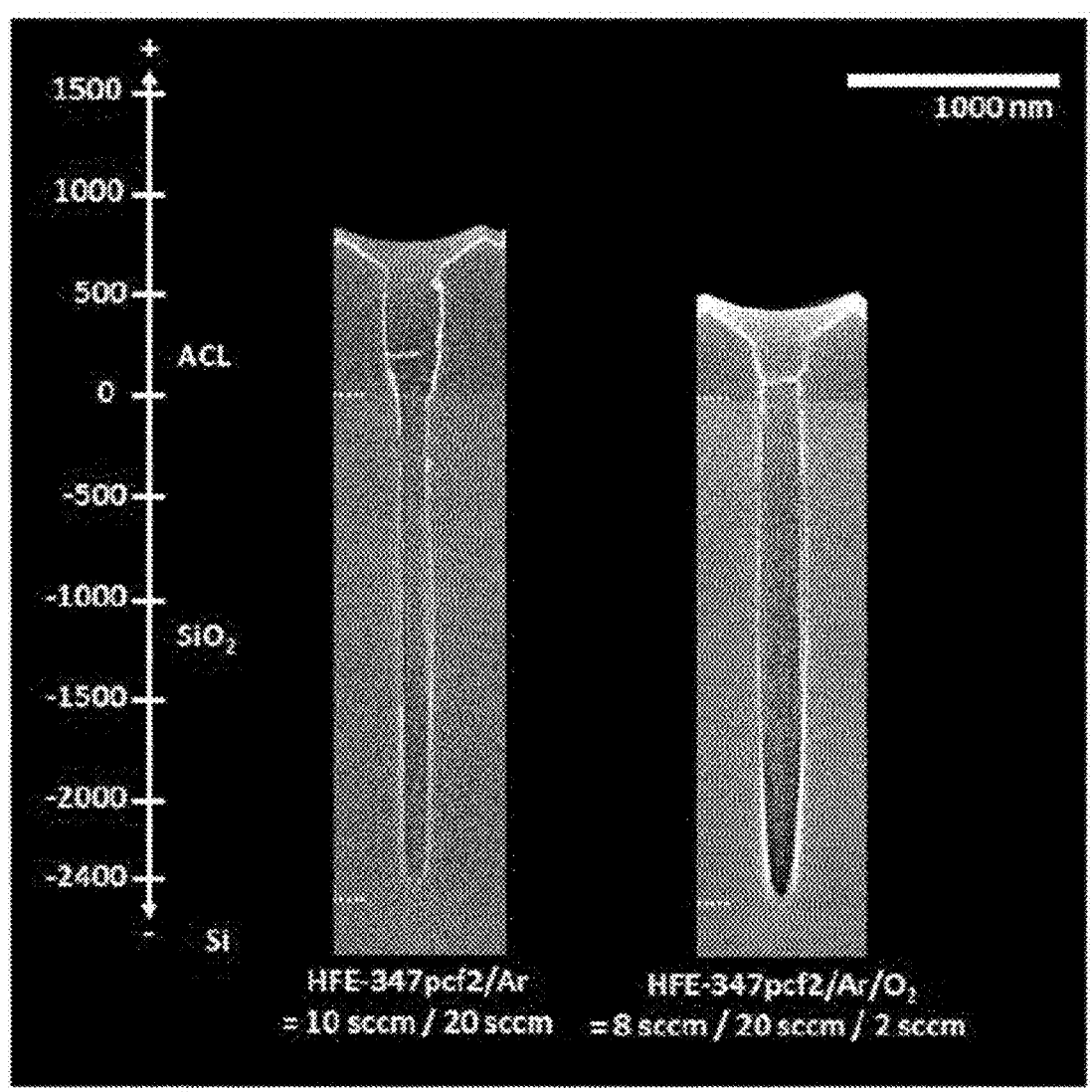
FIG. 9 is a view showing a result of a high aspect ratio etched structure using each of HFE-347pcf2/Ar and HFE-347pcf2/Ar/O$_2$ according to the present disclosure.

Referring to FIG. 9, it may be identified that (a) when HFE-347pcf2/Ar is used and (b) when HFE-347pcf2/Ar/$O_2$ is used, the specimen has been etched to a bottom corresponding to a depth of 2400 nm after 12 minutes of the etching time. Change in a hole diameter based on an etching depth is identified. It may be identified that (b) when HFE-347pcf2/Ar/$O_2$ is used, the hole diameter based on the etching depth increases. Thus, it may be identified that when etching is performed in addition of 02, bowing occurs, and thus the hole diameter is larger than 200 nm at an etching depth in a range of 500 to 1500 nm.

In the present disclosure, high aspect ratio etching using liquid HFE-347pcf2 was identified based on an experimental example. Thus, it was identified that an eco-friendly plasma etching method capable of manufacturing a high aspect ratio structure was provided.

Although the disclosure has described above with reference to a preferred embodiment of the present disclosure, those skilled in the art may variously modify and change the present disclosure without departing from the spirit and scope of the present disclosure as described in the claims below.

What is claimed is:

1. A plasma etching method comprising:

a first step of providing a mixed gas containing argon gas and vaporized 1,1,2,2-tetrafluoroethyl-2,2,2-trifluoroethyl ether having a molecular structure of a following Chemical Formula 1 to a plasma chamber in which an etching target is disposed, wherein the vaporized 1,1,2,2-tetrafluoroethyl-2,2,2-trifluoroethyl ether exists in a liquid state at room temperature; and a second step of etching the etching target using plasma generated from the mixed gas:

<Chemical Formula 1>

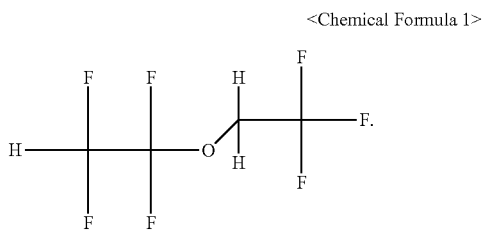 [SMILES: FC(F)C(F)(F)OCC(F)(F)F]

2. The method of claim 1, wherein the 1,1,2,2-tetrafluoroethyl-2,2,2-trifluoroethyl ether gas and the Ar gas are injected into the plasma chamber at a flow rate ratio in a range of 2:3 to 1:9.

3. The method of claim 1, wherein the 1,1,2,2-tetrafluoroethyl-2,2,2-trifluoroethyl ether gas and the Ar gas are injected into the plasma chamber at a flow rate ratio in a range of 10.5:19.5 to 1:4.

4. The method of claim 1, wherein the mixed gas further contains oxygen gas.

5. The method of claim 4, wherein the 1,1,2,2-tetrafluoroethyl-2,2,2-trifluoroethyl ether gas and the oxygen gas are injected into the plasma chamber at a flow rate ratio in a range of 9:1 to 7:3.

6. The method of claim 1, wherein the etching target includes silicon oxide or silicon nitride.

7. The method of claim 1, wherein a hole pattern mask is formed on a surface of the etching target,
wherein in the second step, an etching target area exposed through the hole pattern mask is etched so that a high aspect ratio hole having a ratio between a diameter and a depth of 1:10 or greater is formed in the etching target.

* * * * *